United States Patent [19]

Nishimatsu et al.

[11] Patent Number: 5,140,272
[45] Date of Patent: Aug. 18, 1992

[54] METHOD OF SEMICONDUCTOR SURFACE MEASURMENT AND AN APPARATUS FOR REALIZING THE SAME

[75] Inventors: Shigeru Nishimatsu, Kokubunji; Tatsumi Mizutani, Koganei; Ryo Haruta, Fuchu; Kanji Tsujii, Tokyo; Chusuke Munakata, Tokyo; Shigeyuki Hosoki, Hachioji, all of Japan

[73] Assignee: Hitachi, Ltd., Tokyo, Japan

[21] Appl. No.: 248,497

[22] Filed: Sep. 23, 1988

[30] Foreign Application Priority Data

Sep. 25, 1987 [JP] Japan .................. 62-238726

[51] Int. Cl.⁵ .............................................. G01R 31/36
[52] U.S. Cl. .................. 324/662; 324/158 R; 324/690
[58] Field of Search .......... 324/60 R, 61 R, 71.5, 324/158 D–158 R, 662, 663, 671, 687, 690, 619, 519; 250/492.2

[56] References Cited

U.S. PATENT DOCUMENTS

| | | | |
|---|---|---|---|
| 32,457 | 7/1987 | Matey | 324/662 |
| 3,263,167 | 7/1966 | Foster et al. | 324/61 R |
| 3,990,005 | 11/1976 | Abbe et al. | 324/61 R |
| 4,051,437 | 9/1977 | Lile et al. | 324/158 R |
| 4,287,473 | 9/1981 | Sawyer | 324/158 R |
| 4,333,051 | 6/1982 | Goodman | 324/158 D |
| 4,464,627 | 8/1984 | Munakata | 324/158 D |
| 4,644,264 | 2/1987 | Beha et al. | 324/73 R |
| 4,751,457 | 6/1988 | Veenendaal | 324/158 F |
| 4,758,786 | 7/1988 | Hafeman | 324/158 D |
| 4,772,846 | 9/1988 | Reeds | 324/158 R |
| 4,814,691 | 3/1989 | Garbini et al. | 324/61 P |
| 4,827,212 | 5/1989 | Kamieniecki | 324/158 D |
| 4,859,939 | 8/1989 | Gittleman et al. | 324/158 R |

OTHER PUBLICATIONS

Method for Measurement of Surface Charge Densities on Electrets Sessler and West Sep. 1970 Review of Scientific Instruments.

Primary Examiner—Kenneth A. Wieder
Assistant Examiner—Maura K. Regan
Attorney, Agent, or Firm—Antonelli, Terry, Stout & Kraus

[57] ABSTRACT

A method of semiconductor surface measurement for measuring electrical characteristics of a surface of a semiconductor body is disclosed, by which an electrode, whose surface, which is opposite to the surface of a semiconductor substrate, is flat and the gap between the electrode and the surface is smaller than 0.5 μm.

8 Claims, 4 Drawing Sheets

METHOD OF SEMICONDUCTOR SURFACE MEASURMENT AND AN APPARATUS FOR REALIZING THE SAME

BACKGROUND OF THE INVENTION

This invention relates to semiconductor surface measurement and in particular to a method suitable for measuring the interface trap density (interface state density) at the interface between semiconductor and insulator, the quantity and the distribution of electric charge in the insulator, the life time of carriers in the semiconductor, etc. and an apparatus for realizing the same.

As a representative prior art method of semiconductor surface measurement there is known a method, by which capacitance-voltage (C-V) characteristics are obtained. For the C-V measurement the high frequency (1 MHz) method, the low frequency method, the quasistatic method, etc. are used. The C-V characteristics can be obtained usually by forming an insulating layer 2 on a semiconductor substrate 1 and forming further an electrode 3 made of metal, polycrystalline silicon, etc. Thereon by the evaporation or the chemical vapor deposition (CVD) method as indicated in FIG. 2, so as to obtain a so-called MOS (metal-oxide-semiconductor) structure. A C-V measuring apparatus incorporates a power supply for applying a DC bias thereto.

As a simple method, the C-V characteristics can be measured by putting a drop of mercury or indium-gallium alloy 3a on the insulator 2 formed on the semiconductor substrate 1 so as to obtain an MOS structure, which drop is thrust against the insulator by means of a conductive (metal) rod 5, and using a C-V measuring apparatus 20, as indicated in FIG. 3.

As another method of semiconductor surface measurement, there is known a method of surface photo voltage measurement disclosed in Japanese Journal of Applied Physics, 23 (1984) pp. 1451–1461. The principle of this method is indicated in FIG. 4. That is, a transparent insulator 6 such as Mylar is inserted as a spacer between a transparent electrode 3b supported by a glass plate 7 and the insulator 2 formed on the semiconductor substrate 1 and the insulator 2 is irradiated with light 22 emitted by a light source 21 driven by an AC power supply through an optical system 23. A signal synchronized with the irradiation with the light 22 is inputted in an AC surface photo electro-motive force measuring apparatus 24 and the surface photo electro-motive force measurement is effected through a capacitance. The SPM (Surface Photon Microscope) using the surface photo voltage is described by Chuske MUNAKATA in Oyo Butsuri Vol. 53, No. 3 (1984) pp. 176–182.

SUMMARY OF THE INVENTION

In the case where the electrode and the insulating layer were in contact with each other as by the prior art C-V measuring methods indicated in FIGS. 2 and 3, it was difficult to obtain the charge distribution near the surface of the insulating layer. In this case, heretofore, the charge distribution near the surface of the insulating layer was approximated by obtaining curves representing the relationship between the thickness and the quantity of electric charge by removing the insulating layer little by little by chemical etching, etc. so as to vary the thickness of the layer and repeating C-V measurements.

On the other hand, for the prior art example indicated in FIG. 4, thin spacers cannot be obtained and they are at least several 10 μm thick. As stated later, it is not possible to effect exact surface measurements, unless the thickness of the spacers is smaller than 2 μm, calculated in terms of the thickness of a silicon dioxide layer.

Further, in the case where the insulating layer on the surface of the semiconductor substrate was very thin, if the electrode was formed directly on the insulating layer, leakage current flowed and there were problems that C-V characteristics could not be exactly measured, etc.

The object of this invention is to resolve these problems.

These problems can be resolved by disposing an electrode, whose air gap between the surface of the semiconductor substrate and itself is variable. That is, measurements are effected by using the insulator and an air condensor connected in series. The measurements may be effected in inert gas such as nitrogen or vacuum instead of air.

For the MOS structure C-V measurements are usually effected by using an SiO$_2$ layer, whose thickness is smaller than 1 μm, although it depends on the doping of the semiconductor substrate. This is because the capacitance hardly varies, when the thickness is greater than 2 μm. Consequently, taking the specific dielectric constant (3.9 for SiO$_2$) into account, it is desirable that the air gap is smaller than 0.5 μm.

For an air gap, by measuring the capacitance it is possible to obtain the distance between the surface of the semiconductor and the electrode. In most of SiO$_2$ layers the electric charges are so distributed that it is strong at the interface with the semiconductor (Si) and the outermost surface and weak and almost constant in the middle portion thereof. Consequently, supposing that electric charge exists at the interface and the outermost surface in a manner, which can be represented by a delta function, and is uniformly distributed in the middle portion of the layer, it is possible to obtain the distribution of the electric charge at the interface, the outermost surface and the middle portion of the layer by measuring the C-V characteristics at 3 points while varying the gap of the air gap electrode. Even if the electric charge is distributed in another reasonable manner, it is possible to assume the distribution of the electric charge in the insulating layer by a non-destructive method using data analysis by means of a computer after having effected a number of C-V measurements while varying the gap.

In the case where the C-V characteristics are obtained by the quasi-static method, etc., if there exists leakage current in the insulating layer, no exact measurements can be effected. However, according to this method, since there exists necessarily a gap, unless tunnel current or discharge takes place, even if the insulating layer is very thin, it is possible to effect C-V measurements. Furthermore, also for semiconductor substrates having no insulating layer such as the surface of a cloven Si, the interface (surface) state density can be measured in an ultra high vacuum. Further evaluation of the surface treatment of layers other than the insulating layer is possible.

Furthermore by the usual AC surface photo voltage measurement method, unless the surface of the semiconductor is inverted, the measurements cannot be effected. Consequently the method for evaluation of Si wafers can be applied only to n-conductivity type Si. On the other hand, by means of the air gap electrode according to this invention the surface of p type Si can be inverted by applying a DC bias to the transparent electrode and therefore it is possible to evaluate also p type Si.

DESCRIPTION OF THE PREFERRED EMBODIMENTS

Embodiment 1

Figure 1:
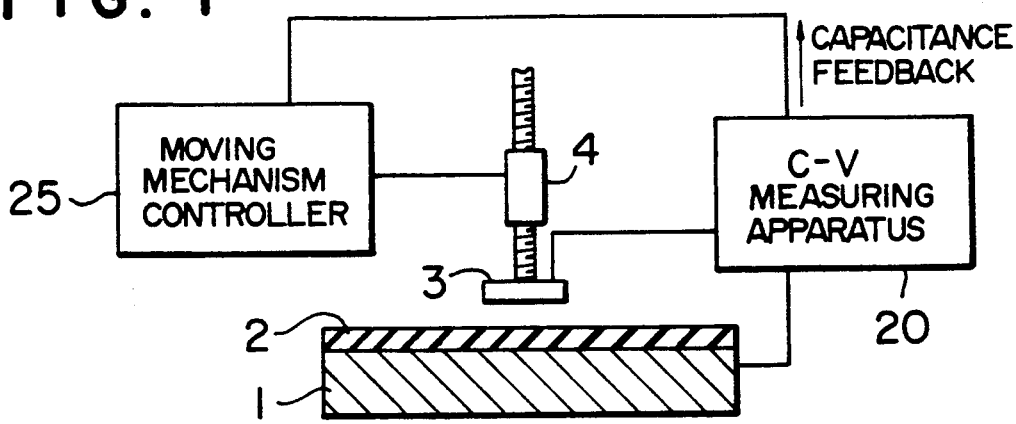
FIG. 1 is a cross-sectional view illustrating an embodiment of this invention.
Figure 2:
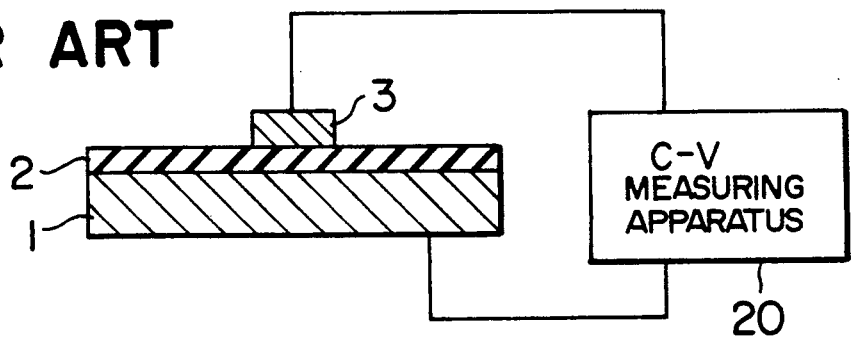
FIGS. 2 and 4 are cross-sectional views indicating three different prior, art methods of semiconductor surface measurement.

FIG. 1 illustrates an embodiment of this invention. An insulating layer (silicon dioxide) 2 is formed on a semiconductor substrate (silicon) 1 to a thickness of 100 nm. This wafer is located on a sample table (not shown in the figure). C-V characteristics are measured by setting an electrode 3 at positions away from the surface of the insulating layer 2 by about 100 nm and about 150 nm by means of a moving mechanism 4. A C-V measuring apparatus incorporates a power supply and measures the C-V characteristics, connected with the electrode 3 and the substrate 1. Since the distance between the electrode and the surface of the substrate can be easily obtained by measuring the capacitance, as stated previously, it is possible to regulate the distance between the electrode and the surface of the substrate by feeding back the value of the capacitance from the C-V measuring apparatus 20 to a moving mechanism controller 25. A mechanism for moving electrode 3 was controlled by a combination of a coarse regulation portion using a micrometer and a fine regulation portion using a piezo actuator.

By using the construction described above it is possible to obtain the C-V characteristics and the electric charge Q induced at the surface of the semiconductor, starting from deviations from the ideal curve for charge zero. This technique is well known.

Figure 3:
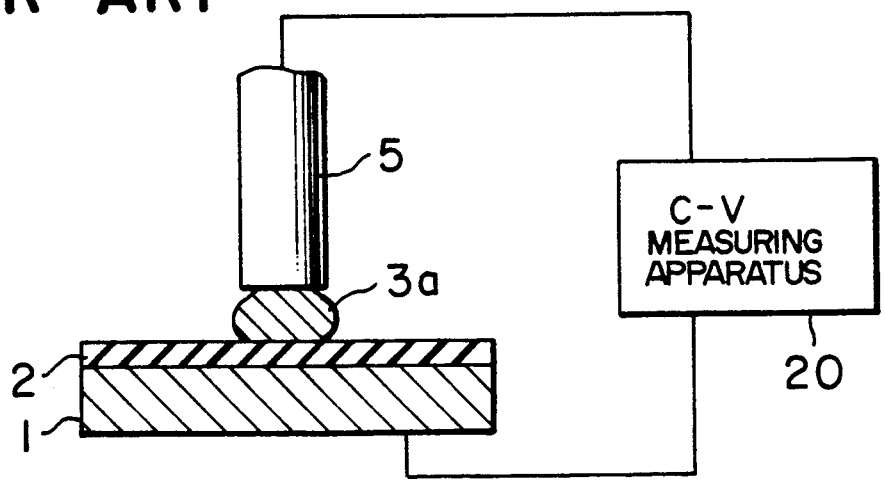
Figure 5A:
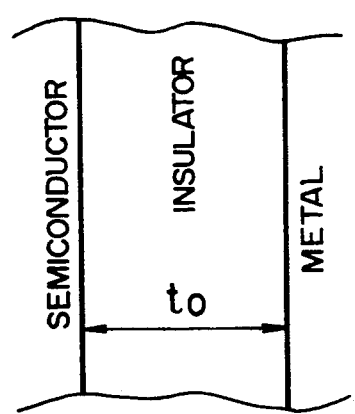
FIGS. 5A and 5B are schemes illustrating the effect of the embodiment of this invention, FIG. 5A being a scheme indicating an electric charge distribution obtained by a prior art method, FIG. 5B being a corresponding scheme obtained by the method according to this invention.
Figure 5A:
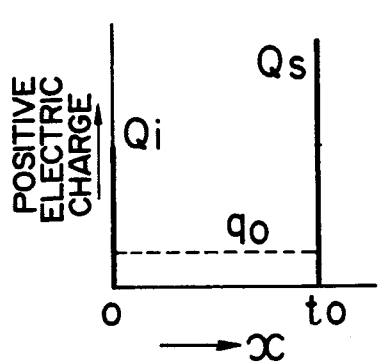

The construction of the mercury probe indicated in FIG. 3 is illustrated schematically in FIG. 5A.

When a positive charge distribution in the insulating layer indicated in the lower part of FIG. 5A is supposed, the electric charge Q induced at the surface of the semiconductor is given by;

$$Q = \frac{e}{t_0} \int_0^{t_0} (t_0 - x)\rho(x)dx \quad (1)$$

where e represents the electric charge of an electron, $t_0$ the thickness of the insulating layer, and $\rho(x)$ the charge distribution in the insulating layer.

If the electric charge at the middle portion the layer is constant and equal to $q_0$, Eq (1) can be transformed as follows;

$$Q = Qi + q_0 \frac{t_0}{2} \quad (2)$$

Figure 5B:
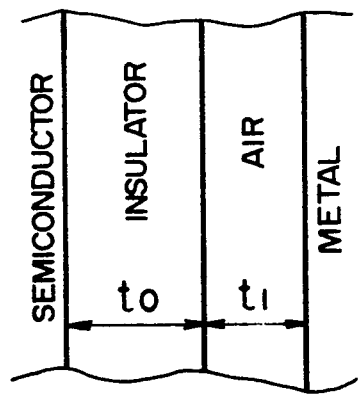
Figure 5B:
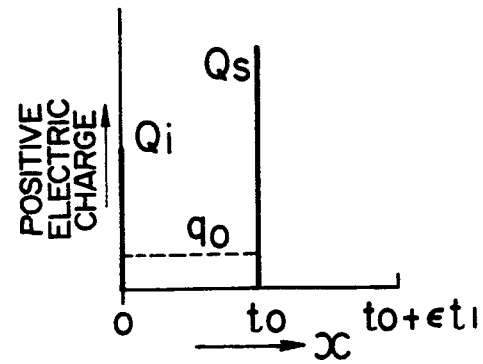

On the other hand, in the case where the air gap electrode according to this invention is used, the electric charge is distributed, as indicated in FIG. 5B, and the following equation is valid;

$$Q = Qi \frac{q_0}{t_0 + \epsilon t_1} \int_0^{t_0} (t_0 + \epsilon t_1 - x)dx + Qs \frac{\epsilon t_1}{t_0 + \epsilon t_1}$$
$$= Qi + q_0 t_0 \frac{t_0 + 2\epsilon t_1}{2(t_0 + \epsilon t_1)} + Qs \frac{\epsilon t_1}{t_0 + \epsilon t_1} \quad (3)$$

where $\epsilon$ represents the specific dielectric constant of the insulator; Qi the charge quantity at the interface; and Qs the charge quantity at the outermost surface.

Here it is possible to obtain Qi, $q_0$ and Qs, by changing the air gap to $t_2$ and $t_3$, measuring the C-V characteristics and obtaining Q. Further, if $q_0$ is approximated by 0, Qi and Qs can be obtained by two measurements at $t_1$ and $t_2$.

The positive charge distribution as indicated in FIGS. 5A and 5B is often observed, in the case where an Si substrate having an $SiO_2$ layer on its surface is irradiated with plasma, etc. That is, it is because electric charge is formed in the $SiO_2$ layer by irradiation with ions, electrons and ultraviolet ray in the plasma. The positive charge distribution in a prior art example measured by etching stepwise the $SiO_2$ layer has also an aspect indicated in FIG. 5A.

Even if the positive charge distribution cannot be represented by a delta function, it is possible to assume the charge distribution in the middle portion of the sample by a processing by means of a computer by obtaining C-V characteristics at a reasonable number of measurement points while varying $t_1$ and calculating the quantity of induced electric charge on the basis thereof.

Embodiment 2

Figure 6:
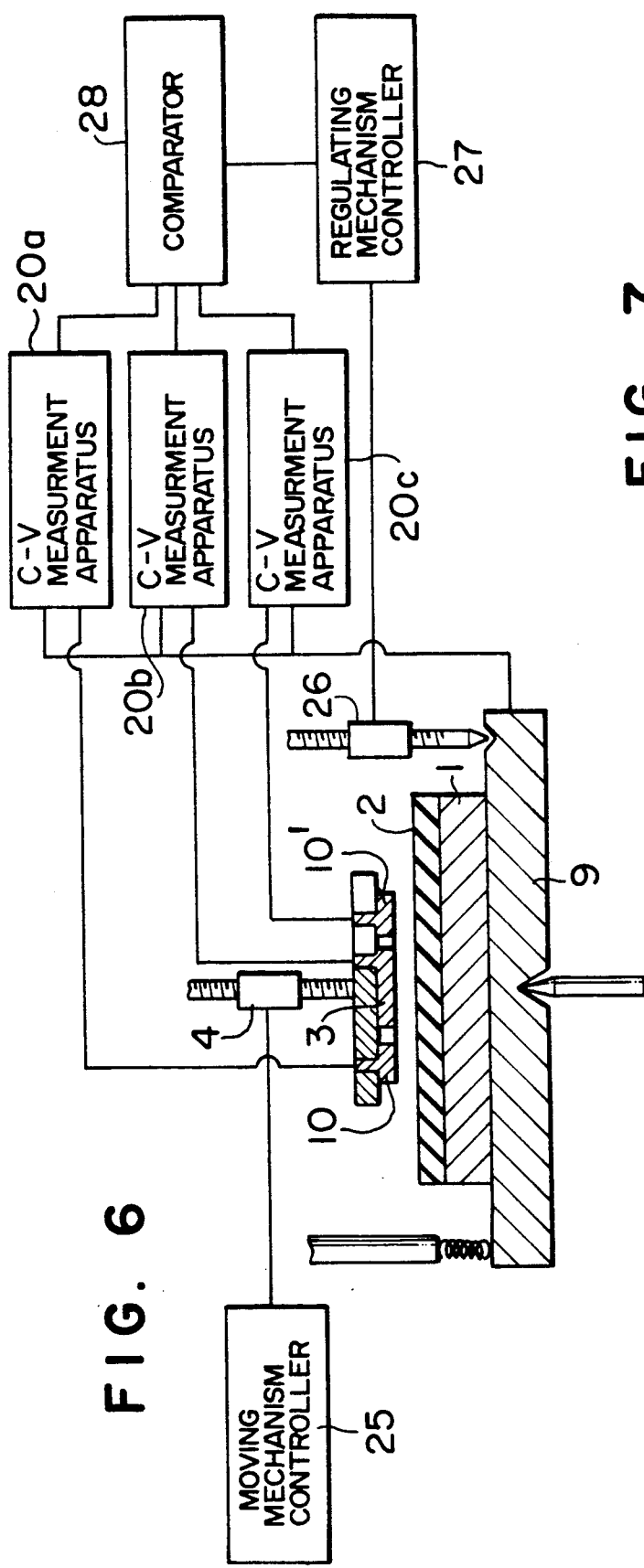
FIGS. 6 to 10 are schemes illustrating the construction of different embodiments of this invention.
Figure 7:
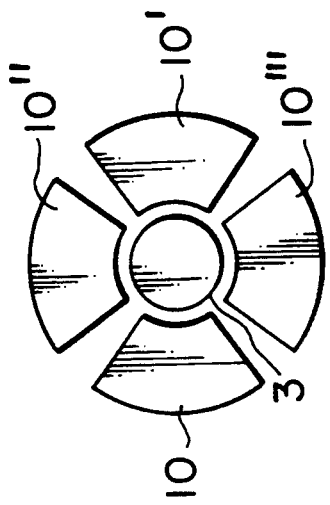

An important point in the realization of this invention is to keep the parallelism between the air gap electrode and the semiconductor sample. FIG. 6 illustrates another embodiment of this invention, in which auxiliary electrodes 10 and 10' are disposed at both the sides of the main electrode 3. The capacitance of each of the electrodes is measured by means of a C-V measuring apparatus. The capacitances thus obtained are compared with each other by means of a comparator 28. The parallelism is maintained by feeding back a regulating mechanism controller 27 so as to equalize them and to drive a regulating mechanism 26 regulating the inclination of the sample table 9, on which the semiconductor substrate 1 covered by the insulating layer 2 is located. In this way it was possible to keep the parallelism between the electrode and the semiconductor sample. Reference numeral 4 represents an electrode moving mechanism. In reality there were disposed 4 auxiliary electrodes 10, 10', 10" and 10''' and also 2 pairs of regulating mechanisms were used. The parallelism connection is possible, if there are more than 2 auxiliary electrodes.

It is also conceivable to detect the parallelism by applying the optics thereto, e.g. to detect the parallelism by means of a split light beam used in a compact disk player, etc.

Embodiment 3

In the embodiment described above an evaporated gold film was used as the electrode. However, the surface of the evaporated film may be strongly uneven so that it cannot be said to be a plain electrode. Therefore an Si wafer doped strongly with impurities such as arsenic phosphor, boron, etc. so as to be semiconductor having a low specific resistivity and mirror-polished was used and satisfactory measurement results were obtained.

Embodiment 4

A silicon wafer is covered usually by a natural oxide film about 2 μm thick. If C-V characteristics were measured with an electrode formed thereon, since the oxide film is extremely thin, leakage current would be significant so that the measurement is substantially impossible. When an air gap was used in a construction indicated in FIG. 1, C-V characteristics was able to be obtained with a gap about 50 μm thick. By this embodiment it was confirmed that negative electric charge is produced on the Si surface by an Si surface treatment using alkali such as hydrazine, ammonical peroxide, etc. That is, it can be said that it is possible to evaluate the effect of the surface treatment of Si, etc. by applying this invention thereto. It was possible to measure C-V characteristics of n-conductivity type Si of 10 Ω-cm with an air gap smaller than 0.5 μm and satisfactory C-V characteristics were obtained with an air gap smaller than 0.1 μm.

Embodiment 5

Figure 8:
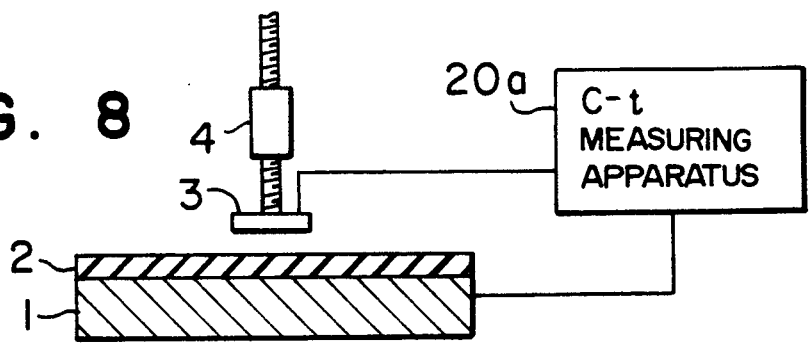

FIG. 8 illustrates still another embodiment of this invention. While in the embodiment indicated in FIG. 1 the C-V measuring apparatus 20 is connected with the electrode 3 and the substrate 1, in the embodiment indicated in FIG. 8 a voltage varying stepwise is applied between the electrode 3 and the substrate 1 by means of a capacitance-time (C-t) measuring apparatus 20a. In this way it is possible to measure the life time and the surface recombination velocity of carriers in the semiconductor by measuring variations in the capacitance with respect to time. The other construction is identical to that of the apparatus indicated in FIG. 1. The C-t measurement itself is well known.

Embodiment 6

Figure 4:
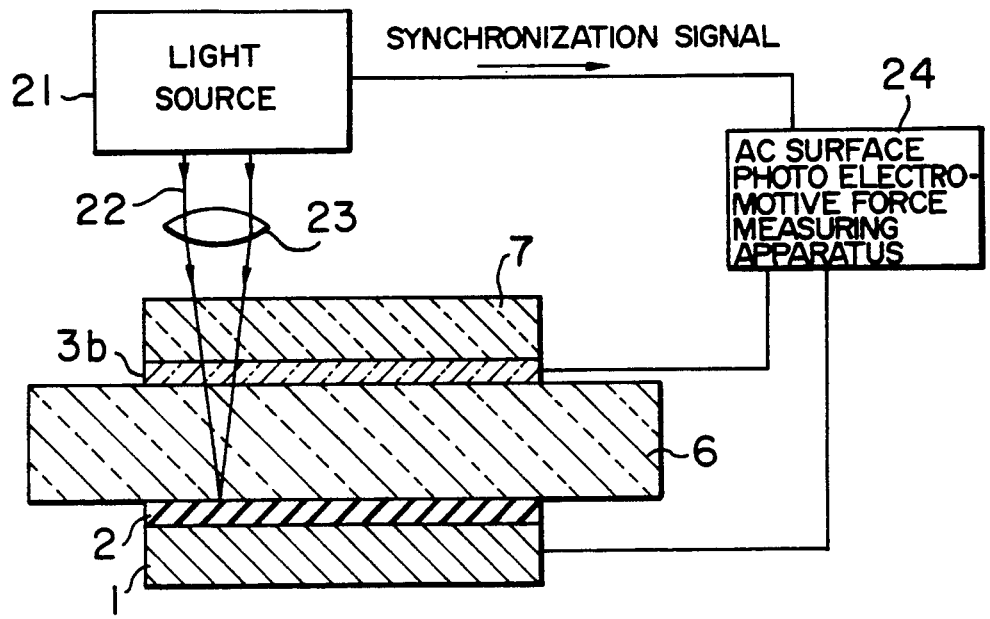
Figure 9:
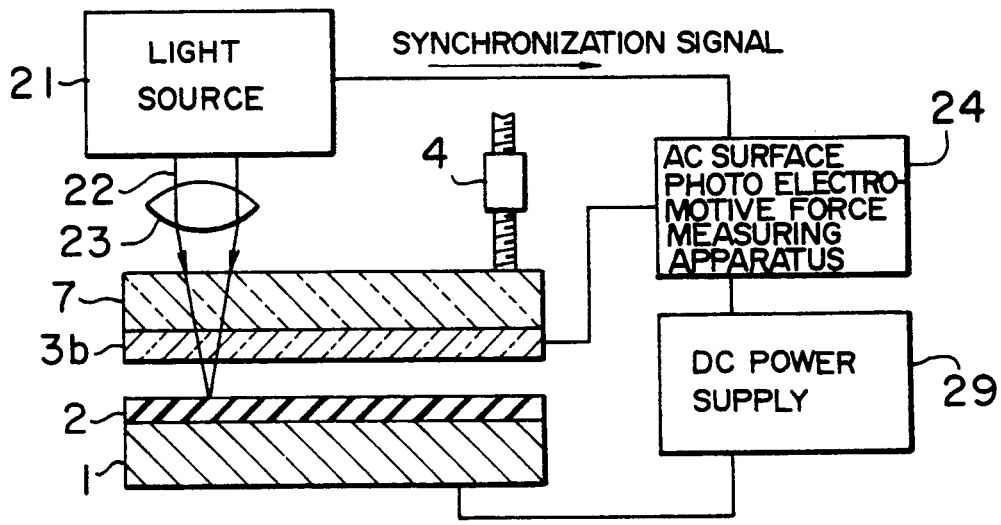

FIG. 9 illustrates still another embodiment of this invention. A bias voltage is applied to a transparent electrode 3b supported by a glass plate 7, whose position is controlled by a moving mechanism 4, by means of a DC power supply 29. In this way it is possible to control the surface potential of the semiconductor substrate (Si) 1, on which an insulating layer 2 is formed, and to measure the surface photo indicated voltage by irradiating the semiconductor substrate with light 8 at an arbitrary surface potential. The surface photo induced voltage can be measured in the same manner as for the prior art example indicated in FIG. 4. That is, a light source 21 irradiates the semiconductor sample with a light beam 22 having a constant frequency through an optical system 23 by an AC power supply and at the same time sends a synchronization signal to an AC surface photo electro-motive force measuring apparatus 24. In this way it is possible to measure the photo electro-motive force in synchronism with the light irradiation. Here the insulating layer 2 may be either a natural oxide layer or a layer obtained by a surface treatment, which influences the surface of the semiconductor substrate.

This embodiment has an effect that it is made easier to obtain the surface electric charge, the interface state density, etc. separately. Further, according to this embodiment it is possible to obtain separately the life time of carriers in a bulk Si by using a capacitance time (C-t) measuring apparatus instead of a C-V measuring apparatus. The method itself for measuring the surface photo electro-motive force is described in the Japanese Journal of Applied Physics stated above.

Furthermore, since usual Si wafers are treated with ammonical peroxide ($NH_4OH$ and $H_2O_2$), the surface thereof is changed to the p type. For this reason the life time measurement for the n-conductivity type Si was able to be effected easily by the prior art technique indicated in FIG. 4, but it was difficult for the p type Si. On the other hand, by using the apparatus indicated in FIG. 8, it was made possible to effect the life time measurement for the p-conductivity type Si, because the Si surface was changed to the n type by applying a positive voltage to the transparent electrode.

EMBODIMENT 7

Figure 10:
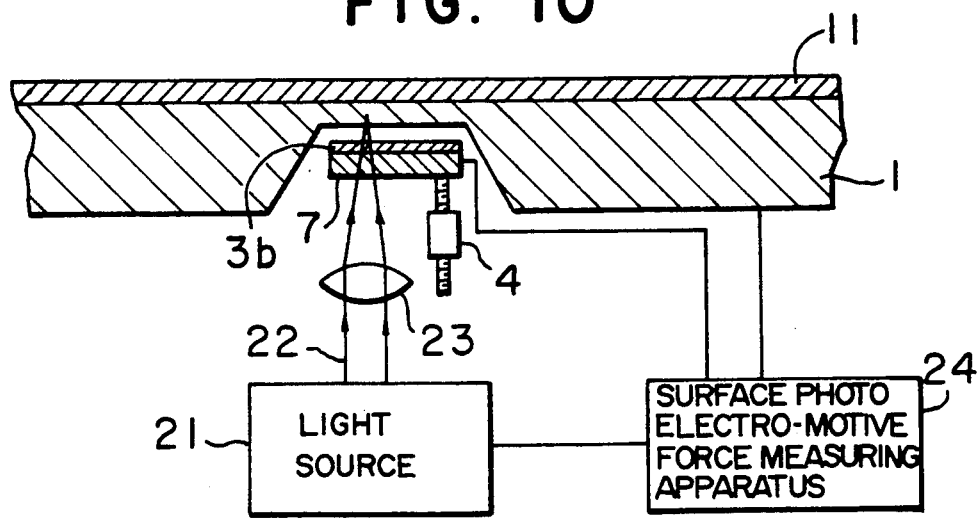

Still another embodiment is illustrated in FIG. 10. If it were tried to observe the silicon substrate 1 from the front side of an LSI Si wafer, it would be usually difficult, because it is prevented by a device wiring layer 11, in which there are disposed wiring, gate electrodes, etc. On the contrary, it was made possible to evaluate Si with a resolution of about 1 μm by forming a recess e.g. by etching on the rear side surface of the Si wafer so that the thickness of the silicon substrate was about 20 μm at the bottom of the recess, as indicated in FIG. 9, and by observing the AC surface photo induced voltage. The other construction is identical to that indicated in FIG. 9.

Embodiment 8

The measurement in Embodiment 4 was effected in the atmosphere. However there were case where stable (reproducible) measurements were difficult because of humidity, etc. in the atmosphere. It was confirmed that this problem is fairly alleviated by making dry nitrogen flow through the measuring system. It was also confirmed that more stable measurements can be effected, if the whole measuring system is set in vacuum.

Embodiment 9

In FIG. 1 it is possible to oscillate the gap electrode at several 100 kHz by constituting the moving mechanism by a stacked actuator and applying an AC voltage thereto. By means of this construction it was possible to measure the potential of the surface of the sample by the principle of the vibrating reed electrometer.

Embodiment 10

In all the preceding embodiments the gap was filled with air or nitrogen or it was evacuated, but it can be filled with a liquid. By using silicone oil $(C_2H_6OSi)_4$ the C-V measurement is possible even with a gap as great as about 4 μm.

This is because the specific dielectric constant of silicone oil is 2.4. If a liquid having a greater specific dielectric constant is used, the gap can be still greater. However, since there are many cases where cleaning and drying are necessary after the measurement, this method may not be efficient.

Although Si was used as the semiconductor in the above embodiments, this invention is useful also for III-V compound semiconductors such as GaAs or II-VI compound semiconductors.

According to this invention, an effect can be obtained that it is possible to obtain the electric charge distribution in an insulating layer disposed on the surface of a semiconductor body without etching it stepwise. It is also possible to obtain also the life time of carrier, the interface state density and the surface electric charge in the semiconductor body, on which there is disposed an insulating layer, through which leakage current is apt to flow, or an extremely thin insulating layer.

Furthermore, in the SPM using the surface photo induced voltage the interface state density and the life time of carriers can be easily obtained. In the reception examination of Si wafers evaluation is possible both for the n type and for the p type and thus the application field is enlarged. In addition, in the defect analysis of LSIs information on Si and Si surface can be obtained with a resolution of about 1 $\mu$m for a structure, in which Si is etched from the rear side so that there remains an Si layer, whose thickness is comprised between several 10 $\mu$m and several $\mu$m.

We claim:

1. An apparatus of semiconductor surface measurement, comprising:
   a sample table, on which a semiconductor sample is located;
   a plate electrode, which is located so as to be opposite to said semiconductor sample with such a gap that it is disconnected with respect to DC and connected with respect to AC;
   means for regulating the gap between said plate electrode and said semiconductor sample;
   means for holding the surface parallelism between said plate electrode and said semiconductor sample;
   means for irradiating said semiconductor sample with light through said electrode; and
   means for measuring the voltage induced by light at the surface of said semiconductor sample.

2. An apparatus according to claim 1, wherein the size of said gap is smaller than 0.5 $\mu$m.

3. An apparatus according to claim 1, wherein said plate electrode is made of a silicon wafer strongly doped with impurity selected from arsenic, phosphor, or boron and mirror-polished.

4. An apparatus according to claim 1, wherein the space forming said gap is evacuated.

5. An apparatus according to claim 1, wherein the space forming said gap is filled with gas or liquid.

6. An apparatus according to claim 1, wherein said gap regulating means comprises:
   means for varying the size of said gap.

7. An apparatus according to claim 1, wherein said gap regulating means comprises:
   means for oscillating said plate electrode in the direction perpendicular to the surface of said semiconductor sample.

8. An apparatus according to claim 1, wherein said surface parallelism holding means includes:
   means for detecting the surface parallelism between said plate electrode and said semiconductor sample.

* * * * *